United States Patent
Runyon

(10) Patent No.: US 6,480,992 B1
(45) Date of Patent: Nov. 12, 2002

(54) METHOD, APPARATUS, AND PROGRAM PRODUCT FOR LAYING OUT CAPACITORS IN AN INTEGRATED CIRCUIT

(75) Inventor: Stephen Larry Runyon, Pflugerville, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/435,867

(22) Filed: Nov. 8, 1999

(51) Int. Cl.$^7$ .............................................. G06F 17/50

(52) U.S. Cl. .......................................... 716/10; 716/11

(58) Field of Search ................................... 716/8, 10, 11

(56) References Cited

U.S. PATENT DOCUMENTS 5,801,959 A * 9/1998 Ding ........................... 716/11
5,811,868 A   9/1998 Bertin et al.
6,028,990 A * 2/2000 Shahani ........................ 716/8

OTHER PUBLICATIONS

Chen, "On chip decoupling capacitor optimization for high performance VLSI design", IEEE, pp. 99–103.*
Chen, "Minimizing chip level simultaneous switching noise for high perfromance micro design", IEEE, pp. 544–547.*

* cited by examiner

Primary Examiner—John F. Niebling
Assistant Examiner—Stacy Whitmore
(74) Attorney, Agent, or Firm—Casimer K. Salys, Esq.; Russell D. Culbertson, Esq.; Shaffer & Culbertson, LLP

(57) ABSTRACT

The method includes defining at least one sizing parameter for a capacitor arrangement (11). Once the parameter or parameters are defined, the method includes applying at least one sizing parameter to select a particular capacitor arrangement (11) for a free area on the integrated circuit chip (12). The selected capacitor arrangement comprises the largest arrangement which is accommodated within the free area, subject to the sizing parameter or parameters employed. Sizing parameters may include a height dimension range between a maximum and minimum height dimension for the capacitor arrangement, and permissible width dimensions for the capacitor arrangement. Steps in the layout method may be performed on a computer system (51) under the control of operational program code.

18 Claims, 8 Drawing Sheets

METHOD, APPARATUS, AND PROGRAM PRODUCT FOR LAYING OUT CAPACITORS IN AN INTEGRATED CIRCUIT

CROSS-REFERENCE TO RELATED APPLICATIONS

This application is related to the following U.S. Patent Applications:
(1) application Ser. No. 09/435,872, filed Nov. 8, 1999, entitled "DECOUPLING CAPACITOR STRUCTURE AND METHOD FOR MAKING AN INTEGRATED CIRCUIT CAPACITOR," now U.S. Pat. No. 6,320,237 and
(2) application Ser. No. 09/435,863, filed Nov. 8, 1999, entitled "ON-CHIP DECOUPLING CAPACITOR ARRANGEMENT PROVIDING SHORT CIRCUIT PROTECTION."

The disclosure of each of these related applications is incorporated herein by this reference.

TECHNICAL FIELD OF THE INVENTION

This invention relates to the design and layout of integrated circuits incorporating decoupling capacitors. More particularly, the invention relates to a method and apparatus for selecting certain dimensions in a decoupling capacitor arrangement to increase the decoupling capacitance available on the integrated circuit chip.

BACKGROUND OF THE INVENTION

The high switching rates used in a modern integrated circuit may cause the supply voltage to degrade at certain points in the circuit, and this reduced supply voltage may cause circuit failures. Capacitors may be used to reduce supply voltage variations arising from high switching rates in the supplied circuits. These decoupling capacitors are connected between the supply voltage and ground in parallel with the supplied circuit. This parallel capacitance tends to decouple the voltage supply from disturbances induced by activity in the supplied circuit, and allow the voltage supply to remain at the intended level.

In earlier integrated circuits, the decoupling capacitance could be placed off-chip due to the relatively slow cycle times at which the earlier circuits operated. The relatively low frequency response exhibited by these off-chip capacitor structures could still accommodate the relatively slow switching rates of the earlier circuits. In addition, the on-chip circuitry itself provided a large amount of near-by decoupling capacitance. As semiconductor fabrication technologies advance, however, circuit devices such as transistors are packed more and more densely on integrated circuit chips. At the same time, the resulting circuits operate at faster cycle times and have less capacitance. At current cycle times on the order of 1 GHz, off-chip capacitance takes many processor cycles to respond. The slow frequency response of off-chip capacitance makes off-chip capacitor arrangements unsuitable for providing the decoupling capacitance necessary to prevent circuit failures in these faster integrated circuit devices. Further, silicon-on-insulator ("SOI") technology allows for still faster cycle times, while reducing the capacitance of on-chip, non-switching circuitry.

In order to provide sufficient decoupling capacitance at the frequency response necessary in modern higher-frequency circuits, the capacitance must be moved closer to the switching circuitry, onto the integrated circuit chip itself.

However, there are a number of problems associated with building capacitor structures on-chip. One problem is the space required for capacitor structures. Only a very limited amount of space is commonly available on-chip for decoupling capacitors. Thus, the on-chip capacitors must be implemented so as to provide as much capacitance per unit area of chip space as possible.

Another problem associated with on-chip capacitor structures relates to errors which may occur in fabrication. A capacitor structure generally requires a first layer of conductive material coupled to the chip supply voltage, a second layer of conductive material coupled to ground, and a thin dielectric layer separating the two layers of conductive material. The capacitance and frequency response of the structure is generally enhanced by keeping the layer of dielectric material as thin as possible between the conductive layers, while keeping the two conductive layers electrically isolated from each other. In semiconductor fabrication, however, electrical shorts may occur across a thin layer of dielectric material such as silicon dioxide, for example. A short across a dielectric layer used in semiconductors is more likely to occur in a capacitor structure in which a thin dielectric layer separates two conductive materials over a relatively large area. Where such a short occurs, the resulting excessive current through the semiconductor material may make the chip unusable.

Switching elements may be incorporated into the chip to electrically isolate capacitor structures which include an electrical short. For example, a transistor structure may be connected in series with a capacitor arrangement. If the capacitor arrangement proves to have a short which results in excessive current, the transistor can be switched to isolate the capacitor from the chip power supply. Thus, the chip including such a capacitor structure fault may be usable in spite of the fabrication fault. These series transistors, however, take up valuable chip area and generally complicate the chip structure.

A further problem associated with on-chip capacitor arrangements involves the layout of such arrangements on the chip. A circuit design may leave many different free areas which may be used for on-chip capacitor structures. As used in this disclosure a "free" area may comprise any area not occupied by the normal circuitry of the chip, including areas left specifically for capacitor structures, wiring limited spaces, and chip "white space" between irregular shaped circuit blocks. These free areas may include many different sizes and shapes, and thus a number of prior art capacitor cell designs were required to make use of the various areas for decoupling capacitance. However, maintaining a large number of capacitor cells causes logistical problems and requires a great deal of designer time considering a given chip may require hundreds of thousands of decoupling capacitors.

SUMMARY OF THE INVENTION

It is an object of the invention to provide a method for laying out on-chip capacitor structures to increase on-chip decoupling capacitance. The method may be easily automated using a computer system and program to vary a single basic capacitor arrangement design so as to effectively fill each desired free area on a chip and provide the highest possible decoupling capacitance using the given area, while requiring minimal design resources.

The method according to the invention is employed using the capacitor arrangement set out in related application Ser. No. 09/435,872, entitled DECOUPLING CAPACITOR STRUCTURE AND METHOD FOR MAKING AN INTEGRATED CIRCUIT CAPACITOR and application Ser. No. 09/435,863 entitled ON-CHIP DECOUPLING CAPACITOR ARRANGEMENT PROVIDING SHORT CIRCUIT PROTECTION. While certain details of this capacitor arrangement are set out in this disclosure for the purposes of describing the present invention, further details of the structure are set out in the related applications.

The capacitor arrangement includes one or more elongated capacitor structures. Each capacitor structure includes a device body formed from a semiconductor material, with the device body bounded on either lateral side by a lateral semiconductor region. Each capacitor structure further includes a dielectric layer overlaying the device body, and an anode body overlaying the dielectric layer in an area defined by the device body. Where the capacitor arrangement includes multiple capacitor structures, the structures are arranged side-by-side with the device bodies forming a series of fingers interdigitated with lateral regions.

With the lateral regions coupled to ground and the anodes coupled to the chip supply voltage, each individual capacitor structure functions as a capacitor between the supply voltage and ground. The overall capacitance provided by the capacitor arrangement for given materials and dielectric thickness is determined by the total area of the anode bodies in the arrangement. Thus, the overall capacitance of a capacitor arrangement used according to the present invention is increased by increasing the height and width of the individual anode fingers in the arrangement to the extent possible and by adding additional capacitor structures in the side-by-side arrangement.

As set out fully in related application Ser. No. 09/435,863, entitled ON-CHIP DECOUPLING CAPACITOR ARRANGEMENT PROVIDING SHORT CIRCUIT PROTECTION the capacitor arrangement provides a current limiting function in the event of a short between an anode body and a corresponding device body or lateral region. The dimensions of the various elements of the capacitor arrangement can be chosen to ensure that for any possible short location, the resulting current through the structure is below some maximum allowable current level.

The dimension requirements in the capacitor arrangement to provide the desired short circuit protection represent the minimum dimension for the height and maximum dimension the width of each capacitor structure in the arrangement. The maximum dimension for the height of each capacitor structure in the capacitor arrangement is determined by the frequency response desired in each capacitor structure. According to the invention, the same basic capacitor arrangement may be varied within the constraints of minimum and maximum height dimensions and permissible width dimensions to make the most efficient use of free space on an integrated circuit chip for on-chip capacitance. Particular capacitor arrangements according to the invention are designed by "stretching" at least one design parameter within certain constraints for the parameter, preferably under computer program control.

The method includes defining at least one sizing parameter for the capacitor arrangement. Preferred sizing parameters include a height dimension range between a maximum and minimum height dimension for the capacitor arrangement, and permissible width dimensions for the capacitor arrangement. Each permissible width dimension comprises a width of the overall capacitor arrangement which may be constructed from one or more capacitor structures. With the parameter or parameters defined, the method includes applying at least one sizing parameter to select a particular capacitor arrangement for a free space on the integrated circuit chip. The selected capacitor arrangement comprises the largest arrangement which is accommodated within the free space, subject to the sizing parameter or parameters employed. Although free areas may be identified manually, such areas are preferably identified automatically from the chip layout.

In one preferred form of the invention, both capacitor height and width parameters are used in selecting a particular capacitor arrangement for a particular free area. A height parameter may comprise a height dimension range between a maximum height dimension for the capacitor arrangement and a minimum height dimension. A width parameter may comprise a plurality of permissible width dimensions based on a single capacitor structure as described above, or multiple capacitor structures. The permissible widths may vary depending on the height dimension, or may be fixed widths. Applying the height and width parameters to select a particular capacitor arrangement comprises selecting a capacitor height dimension from the height dimension range and selecting a capacitor arrangement width dimension from the permissible width dimensions. According to the invention, the selected height dimension comprises the greatest dimension in the range which is less than or equal to the free area height dimension, and within the minimum/maximum range. The selected width dimension comprises the greatest width dimension which is less than or equal to the free area dimension and still one of the plurality of permissible width dimensions. Thus, the method according to the invention selects the largest capacitor arrangement dimensions for the free area while retaining the same basic capacitor arrangement structure. Further, this selection may be done automatically by a computer program, and may be done very late in the design cycle at a time when the free areas are known exactly.

The capacitor arrangement described above and in the related applications provides a high value of capacitance per unit area of the arrangement with a minimal amount of design resources. Applying the present method to effectively size each capacitor arrangement for the particular free areas in the chip layout amplifies the benefits of the capacitor arrangement by making the most of the available free area. The sizing parameters ensure that the resulting capacitor arrangement provides the highest decoupling capacitance at the desired frequency response, while providing integral short circuit protection.

According to the invention, the method may be performed by a computer system programed with software to perform particularly the steps of identifying each free area in the circuit layout and selecting the capacitor arrangement for each free area subject to the defined parameter or parameters. The sizing parameters may be predefined and then entered as inputs to the system, or may be calculated by suitable means in the system, eliminating the need to individually design a large number of these devices.

These and other objects, advantages, and features of the invention will be apparent from the following description of the preferred embodiments, considered along with the accompanying drawings.

DESCRIPTION OF THE PREFERRED EMBODIMENTS

Figure 1:
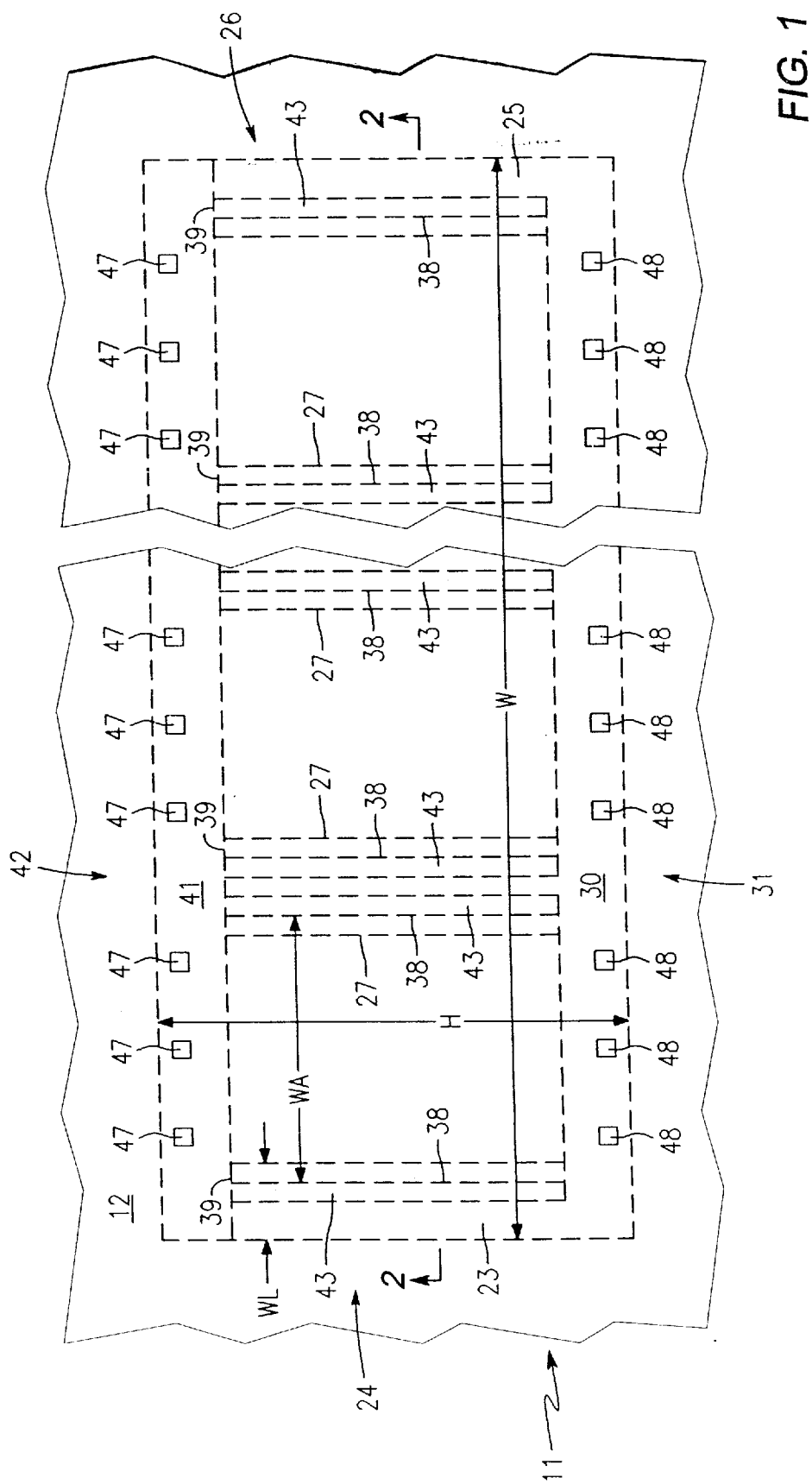
FIG. 1 is a partial plan view of a bulk semiconductor capacitor arrangement which may be is used according to the invention to maximize on-chip capacitance.
Figure 2:
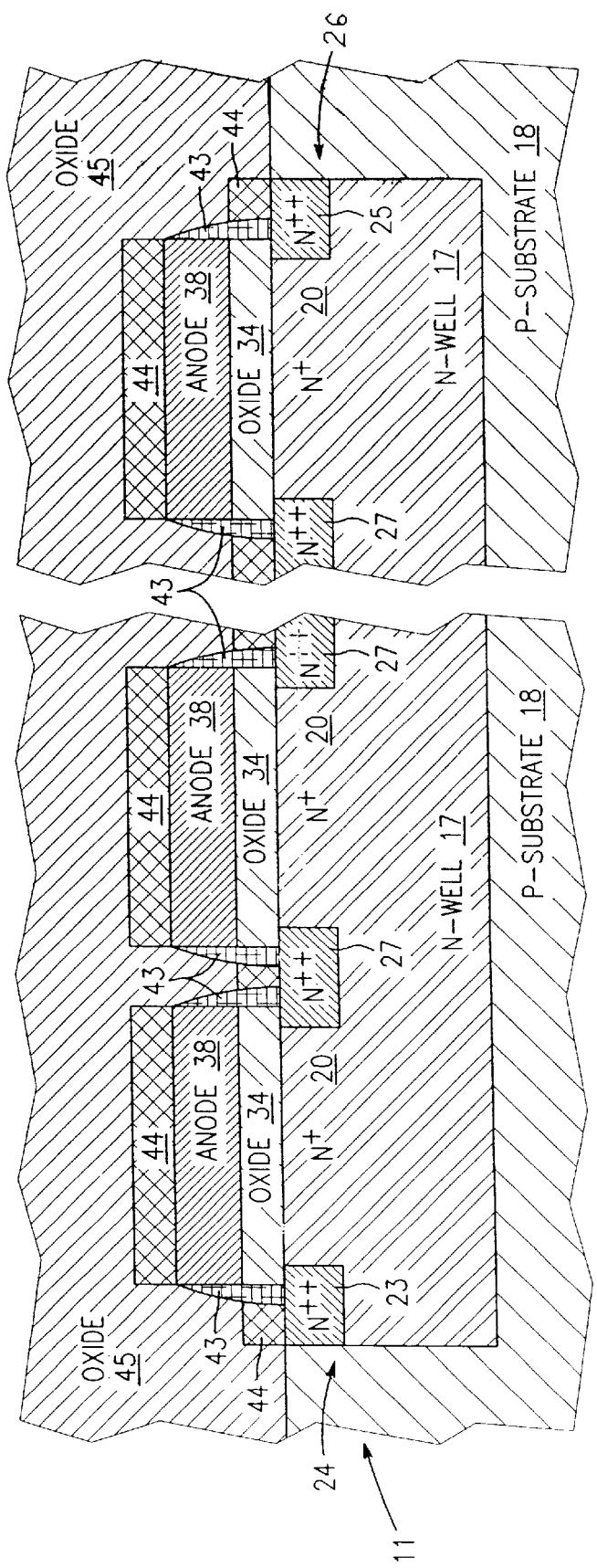
FIG. 2 is a partial representational view in section taken along line 2—2 in FIG. 1.

FIGS. 1 and 2 show a capacitor arrangement 11 embodying the principles of the invention implemented in a bulk semiconductor integrated circuit chip 12. As set out particularly in the related applications identified above, the invention may be implemented in a SOI integrated circuit chip, and thus the invention is not limited to the bulk embodiment shown for purposes of example in FIGS. 1 and 2. It will be appreciated that the views shown in FIGS. 1 and 2 are representational views which show the basic relationship between the various elements of the capacitor arrangement which may be used according to the present invention. The semiconductor regions or layers and the other components of the structure are shown in greatly exaggerated scale, with some components exaggerated more than others. Also, in an actual device, boundary lines between materials in the structure may not form straight lines as depicted for purposes of illustration in the figures. The relationships between the various materials shown in the figures are intended to clearly illustrate the invention without obscuring the invention in unnecessary detail.

Referring to FIGS. 1 and 2, the bulk semiconductor capacitor arrangement 11 is formed in an N-well 17 which is itself formed in P-type substrate material 18. The N-well material forms the device bodies at the locations indicated by reference numeral 20. This material is labeled as N+material in FIG. 2 to indicate the relative doping level. Device bodies 20 may alternatively comprise more heavily doped N-type material as discussed in the related applications.

Lateral regions are formed along both lateral sides of each device body 20. A first lateral end region 23 is formed along the lateral side of device body 20 at a first lateral end 24 of capacitor arrangement 11, while a second lateral end region 25 is formed along a lateral side of device body 20 at a second lateral end 26 of the capacitor arrangement. Capacitor arrangement 11 also includes a plurality of shared lateral regions 27, each shared lateral region being located between adjacent device bodies 20. As shown in FIGS. 1 and 2, the lateral regions 23, 25, and 27 abut the device body material, with the lateral regions together forming a series of fingers which are interdigitated with the series of fingers comprising the plurality of device bodies 20. The first and second lateral end regions 23 and 25, and the shared lateral regions 27 shown in the preferred form of the invention are doped with N impurities more heavily than the N+material which forms each device body 20. This more heavily doped N material is referred to in the figures as N++ material to indicate the concentration of N impurities relative to the device body material.

As shown in FIG. 1, bulk semiconductor capacitor arrangement 11 also preferably includes a ground connection end region 30 at a ground connection end 31 of the capacitor arrangement. Ground connection end region 30 is preferably formed from the same N++ semiconductor material which forms lateral regions 23, 25, and 27, and provides a location for coupling the lateral regions to ground.

Referring to FIG. 2, a dielectric layer 34 is formed over the upper surface of each device body 20. A separate anode or gate layer 38 is formed over dielectric layer 34 in the area defined by the upper surface of each device body 20. Each anode layer 38 preferably extends over the entire area defined by the upper surface of the respective device body 20. This anode layer 38 preferably comprises polycrystalline silicone or some alternative material with similar resistivity characteristics. As shown particularly in FIG. 1, each anode layer 38 also extends past the end 39 of each lateral region 23, 25, and 27 at a supply connection end 42 of capacitor arrangement 11 and connects together with adjacent anode material to form a region 41. This region 41 of anode material at the supply connection end 42 of capacitor arrangement 11 provides a preferred location for coupling the anode material to the circuit supply voltage $V_{dd}$.

As also shown in FIG. 2, insulating side wall material 43 is deposited over the lateral side of each anode 38 and conductive silicate 44 is deposited over each anode and over exposed areas of the lateral regions. An insulator material 45 is formed over the entire capacitor arrangement 11 to isolate the capacitor arrangement generally from chip wiring layers (not shown) which are located above the capacitor arrangement in the chip structure. Conductive supply vias 47 are formed through insulator layer 45 at supply connection end 42 of capacitor arrangement 11 to contact the anode material at region 41 and electrically couple the anode material to the chip supply voltage $V_{dd}$. Vias 48 are also formed through the insulator layer 45 to make contact with ground connection end region 30. Vias 48 serve to couple end region 30, the lateral regions 23, 25, and 27, and each device body 20 to ground.

Each separate device body 20 and its respective anode 38 in capacitor arrangement 11 make up the two "plates" of a capacitor, with dielectric layer 34 electrically isolating the two plates from each other. Thus, each arrangement of device body 20, anode 38, dielectric layer 34, and the respective lateral regions 23, 25, or 27 lying adjacent to the respective device body form a separate capacitor structure shown in the figures at reference numeral 50. Each such capacitor structure 50 forms essentially an IGFET.

The electrical resistance of the materials may be chosen along with the relative length and width dimensions of the anodes 38, device bodies 20, and lateral regions 23, 25, and 27, so that the current arising from a short across dielectric layer 34 will be limited to a current within certain design limitations for the circuit in which capacitor arrangement 11 is implemented. This current limiting feature of the capacitor structure 50 is discussed in detail in the related application entitled ON-CHIP DECOUPLING CAPACITOR ARRANGEMENT PROVIDING SHORT CIRCUIT PROTECTION.

The areas of each anode 38 and respective device body 20 and lateral edges 23, 25, or 27, together with the material chosen for each material, also affect the frequency response of the individual capacitor structures 50. Generally, for a given anode 38 and device body 20 material, the frequency response for the structure 50 decreases as the width and height dimension of anode body 38 increases.

As shown in FIG. 1, capacitor arrangement 11 has an overall height dimension H and an overall width dimension W. The width of each anode 38 is shown in FIG. 1 as WA while the width of each lateral region is labeled WL. Neglecting the portion of dimension H which is taken up by ground connection end region 30 and supply connection end region 41, for given materials and given widths WA and WL, the height dimension H of arrangement 11 is limited by the desired short circuit current limiting properties of structure 50 and the frequency response desired from the structure. The short circuit limiting feature is obtained only above a minimum height dimension H, while the desired high frequency response is obtained only below a maximum for the height dimension. Any height dimension H within the range between minimum and maximum will result in a capacitor structure 50 which provides both the desired short circuit current limiting protection and the desired high frequency response. Thus, the entire capacitor arrangement 11 may be stretched or compressed in a direction transverse to line S shown in FIG. 1 within the range between minimum and maximum height dimension H.

Figure 3:
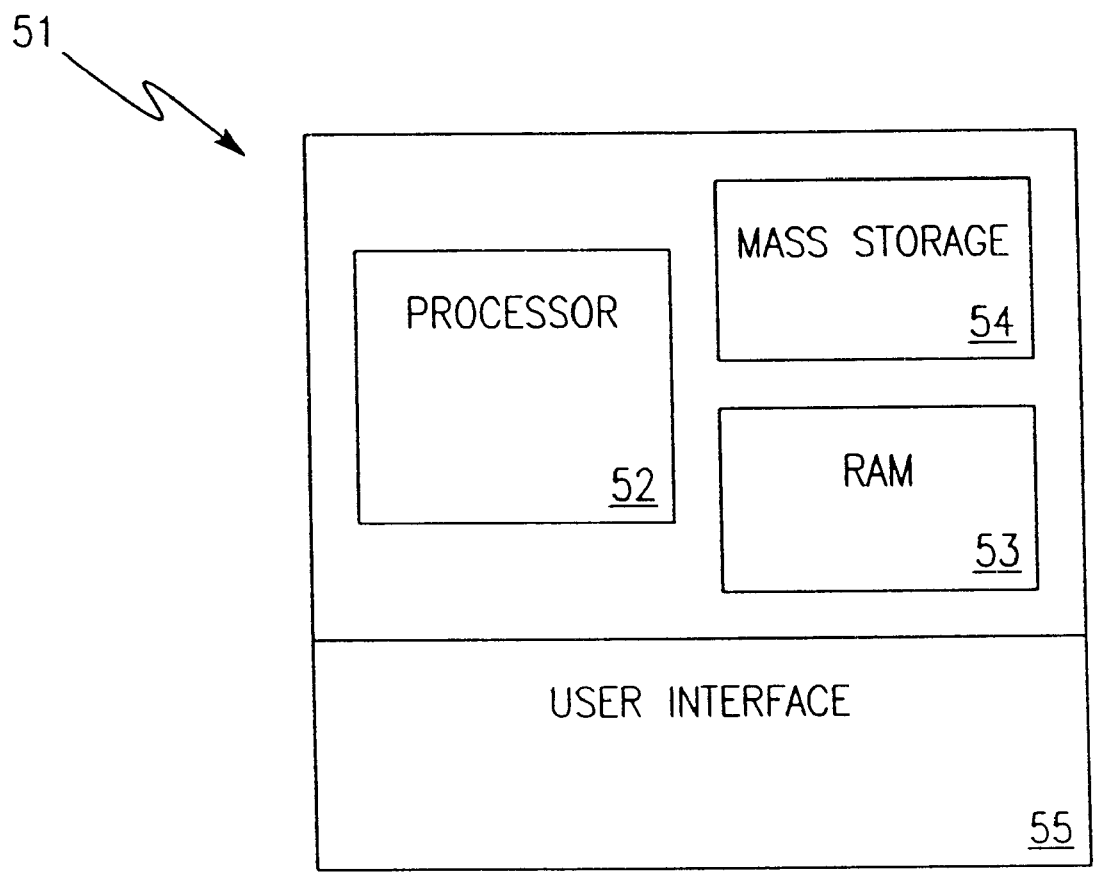
FIG. 3 is a diagrammatic view of a computer system which may be employed to perform the method steps according to the invention.

The method of laying out capacitor arrangements 11 in an integrated circuit chip according to the invention may be described with reference to the flow chart shown in FIG. 4 and computer system 51 shown in FIG. 3. It will be appreciated that each of the method steps set out in FIG. 4 may be performed manually. However, the capacitor arrangement layout method is ideally suited for automation with certain steps performed by computer system 51 under the control of operational software program code. Computer system 51 in FIG. 3 includes a processor 52, random access memory 53, mass storage 54, and a user interface 55. Considering the nature of the steps to be performed, computer system 51 may comprise a personal computer, workstation, or any other suitable computing or processing system.

Figure 4:
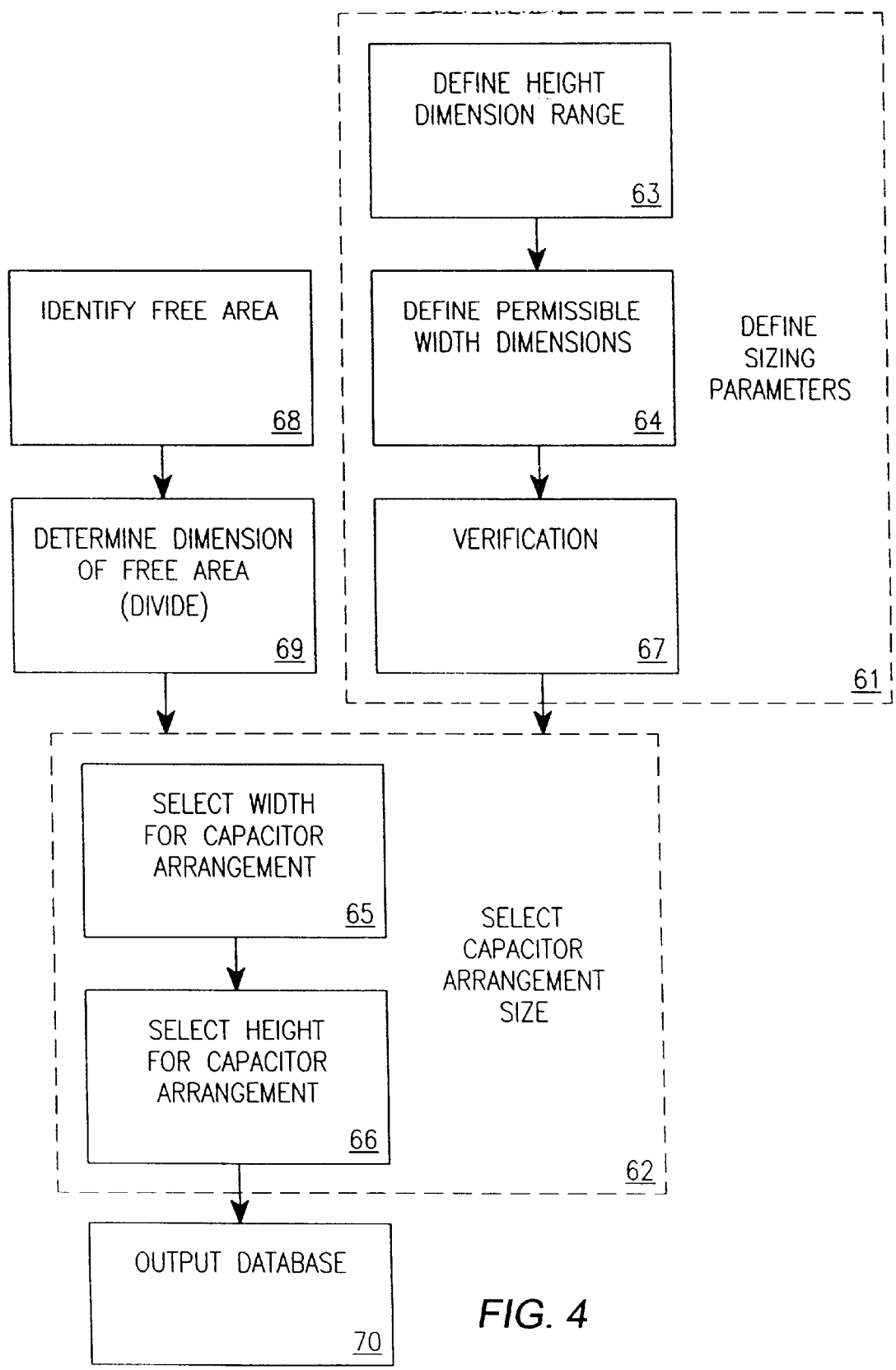
FIG. 4 is flow chart showing a series of process steps for maximizing on-chip capacitance according to the invention.
Figure 5:
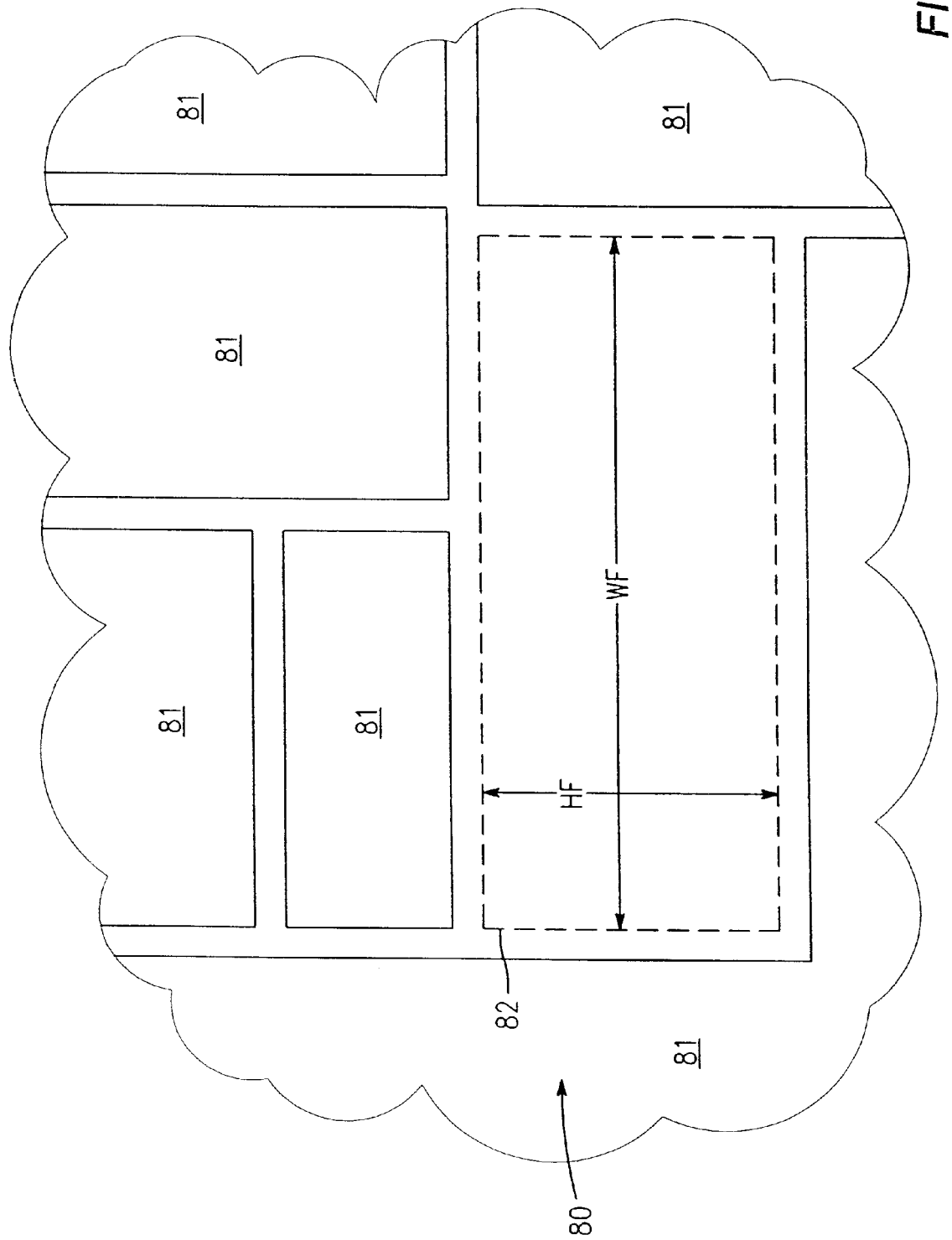
FIG. 5 is a plan view of a portion of an integrated circuit chip layout showing a free area for receiving a decoupling capacitor according to the invention.

The method includes two basic steps shown in dashed boxes 61 and 62 in FIG. 4. The first basic step at dashed box 61 includes defining at least one sizing parameter which is to be used in sizing capacitor arrangement 11 for a particular free area on an integrated circuit chip. This basic step preferably comprises defining a height parameter for capacitor arrangement 11 and a width parameter for the capacitor arrangement. As shown at box 63 in the flow chart, defining the height parameter preferably comprises defining a height range between a maximum and minimum height dimension. As discussed above, these maximum and minimum height dimensions for capacitor arrangement 11 are determined by the short circuit protection desired in the capacitor arrangement and the frequency response desired from the capacitor arrangement. Defining the width dimension preferably comprises defining a plurality of permissible set width values as shown at process block 64. In this preferred embodiment, a first permissible width value may comprise the width of a capacitor arrangement as described above with only a single capacitor structure 50 as shown in FIG. 1. Another permissible width value may comprise a capacitor arrangement having two side-by-side capacitor structures 50. Each permissible width value over this latter value may comprise the width required by a capacitor arrangement having two end structures plus one or more additional capacitor structures 50 between the two end capacitor structures. Width values over two capacitor structures 50 in an arrangement may be conveniently described with the expression $V_n = w_2 + (n-2) w_m$, where n equals the number of capacitor structures 50 in the arrangement, $w_2$ equals the width required by the two end capacitor structures 50 in the arrangement, and w. equals the width required for each additional capacitor structure 50 between the two end structures.

It will be appreciated that the basic step of defining parameters may not involve directly defining height and width parameters. In alternate forms of the invention, the step of defining parameters may comprise simply defining a maximum short circuit current parameter in the resulting capacitor arrangement 11 and a minimum frequency response parameter. With given materials for the components of capacitor arrangement 50, these parameters may be used to optimize the overall height and width of a capacitor arrangement 11 for a given free area, along with the width of the individual capacitor structures 50 within the arrangement.

Also, the step 61 of defining sizing parameters preferably includes a verification step 67 shown in FIG. 4. This verification step includes first laying capacitor arrangements out given the defined sizing parameters, and then modeling the resulting capacitor arrangements to verify the performance of the devices within desired constraints such as frequency response and short circuit protection. Based on the results of the verification step, the sizing parameters may be adjusted and then subjected to another verification process. This definition and verification loop may need to be performed several times to develop the desired sizing parameters.

Regardless of the sizing parameters used in the method, sizing parameter program code used to implement the method through computer system 51 comprises code for receiving and storing the sizing parameter or parameters. With the preferred method of defining a height range parameter and defining a plurality of width values, the computer program product includes, respectively, height input program code for receiving and storing the desired dimension range and width program code for receiving and storing the width dimension values and/or the expression which defines the values.

The second basic step 62 shown in FIG. 4 comprises the step of selecting the capacitor arrangement which provides the largest capacitor arrangement size which can be accommodated in the particular free area. This selection step is performed subject to the sizing parameter or parameters defined in the first step 61. As shown in FIG. 4, the preferred capacitor arrangement size selecting step includes selecting at step 65 a maximum capacitor arrangement width dimension from the plurality of capacitor arrangement width dimensions defined at step 64. This maximum capacitor width dimension comprises the greatest width dimension which is less than or equal to the given free area width dimension and within the plurality of permissible width dimensions defined in step 64. The preferred capacitor arrangement selection step further includes selecting at step 66 a capacitor arrangement height dimension comprising the greatest height dimension which is less than or equal to the given free area height dimension and within the height dimension range defined in step 63. Because of the overhead for contact regions and a border region around the capacitor (required to eliminate space violations with neighboring circuits) the largest possible capacitor arrangement cell will give better area efficiency than multiple cells in the same area.

The program product according to the invention for performing the method through computer system 51 includes sizing program code for selecting the size of capacitor arrangement 11 given the defined parameters. The preferred sizing program code causes computer system 51 to select the capacitor width dimension from the plurality of permissible width values and select the capacitor arrangement height from the predefined height range.

Inputs for the sizing program code comprise the sizing parameter or parameters and commonly a chip database. The chip database includes a number of records defining the position and size of the various circuit elements previously laid out on the chip. The sizing program preferably includes free area identifying code for analyzing the chip database records to identify free areas. Additional code may determine the dimensions of the free areas. The sizing program code then applies the sizing parameters to size one or more capacitor arrangements 11 for each free area. Each sized capacitor arrangement is preferably added as a new record to the database, the new record indicating the location of the capacitor arrangement as well as its dimensions. An output shown at 70 in FIG. 4 preferably comprises a chip database updated with the new records added for each added capacitor arrangement 11. The free area identifying step is shown at process block 68 in FIG. 4. The step of determining the height and width dimension for each respective free area is shown at step 69.

It will be appreciated that a circuit layout may include on the order of hundreds of thousands of separate free areas which may each be used for an on-chip capacitor arrangement 11 shown in FIGS. 1 and 2. Some of these free areas may comprise irregular shapes. In an alternate form of the invention, the method of identifying a free area may include identifying an irregularly shaped free area and dividing the irregularly shaped area into multiple rectangular areas. This preferred process will be described with reference to an example illustrated in FIGS. 7 and 8.

In the alternate form of the invention where irregularly shaped free areas are divided, the program product includes irregular free area identifying program code for identifying the irregular shaped free areas and irregular free area dividing program code for dividing the identified irregular free area into at least one rectangular free area, and perhaps more than one rectangular free area, each for accepting a capacitor arrangement 11 as shown in FIG. 1.

The circuit layout method according to the invention and the operation of the computer system and program product may be described with reference to two separate examples shown in FIGS. 5 through 8. In the first example shown in FIGS. 5 and 6, an integrated circuit chip layout 80 includes a number of circuit blocks 81 containing various circuit elements. Circuit blocks 81 leave a free area 82 suitable for receiving a capacitor arrangement of the type illustrated in FIG. 1. Free area 82 includes width dimension WF and height dimension HF. These dimensions take into account a boundary or spacing from adjacent circuit blocks 81.

Figure 6:
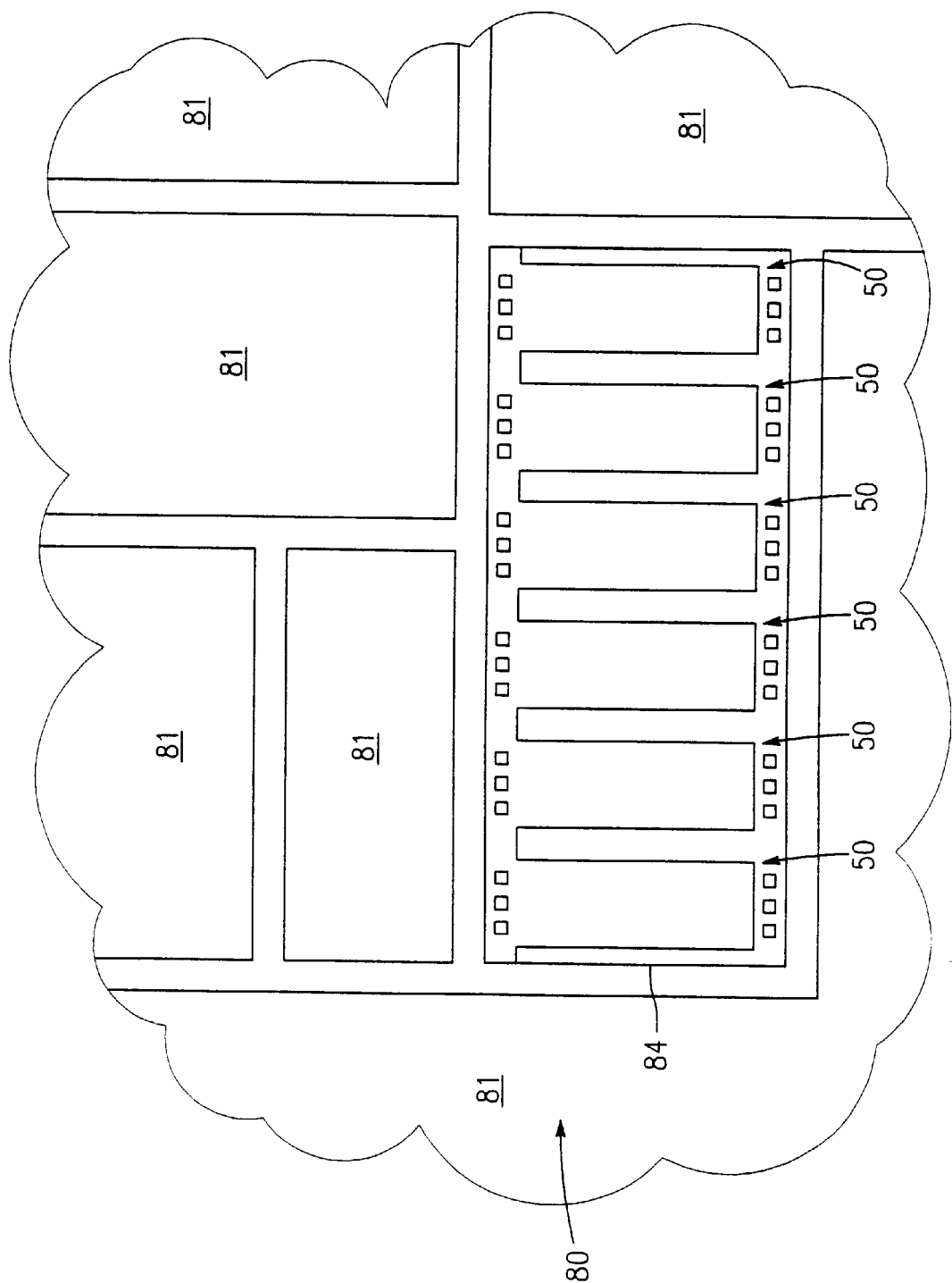
FIG. 6 is a plan view similar to FIG. 5 showing the decoupling capacitor arrangement lay out in the free area.

According to the preferred form of the invention illustrated in FIG. 4, the height dimension range and permissible width dimensions are predefined. In the illustrated example, the set of permissible width dimensions happens to include the width of capacitor arrangement 84 having six separate structures 50. This width dimension WF thus comprises width dimension which is the greatest width dimension in the set which is less than or equal to free area width dimension WF. Also in this example, free area height dimension HF happens to lie within the range for the capacitor arrangement height dimension. Thus, the step of selecting the capacitor arrangement height dimension comprises simply selecting the value HF as the height dimension for the capacitor arrangement 84 shown in FIG. 6. FIG. 6 shows the selected capacitor arrangement 84 laid out in free area 82.

Figure 7:
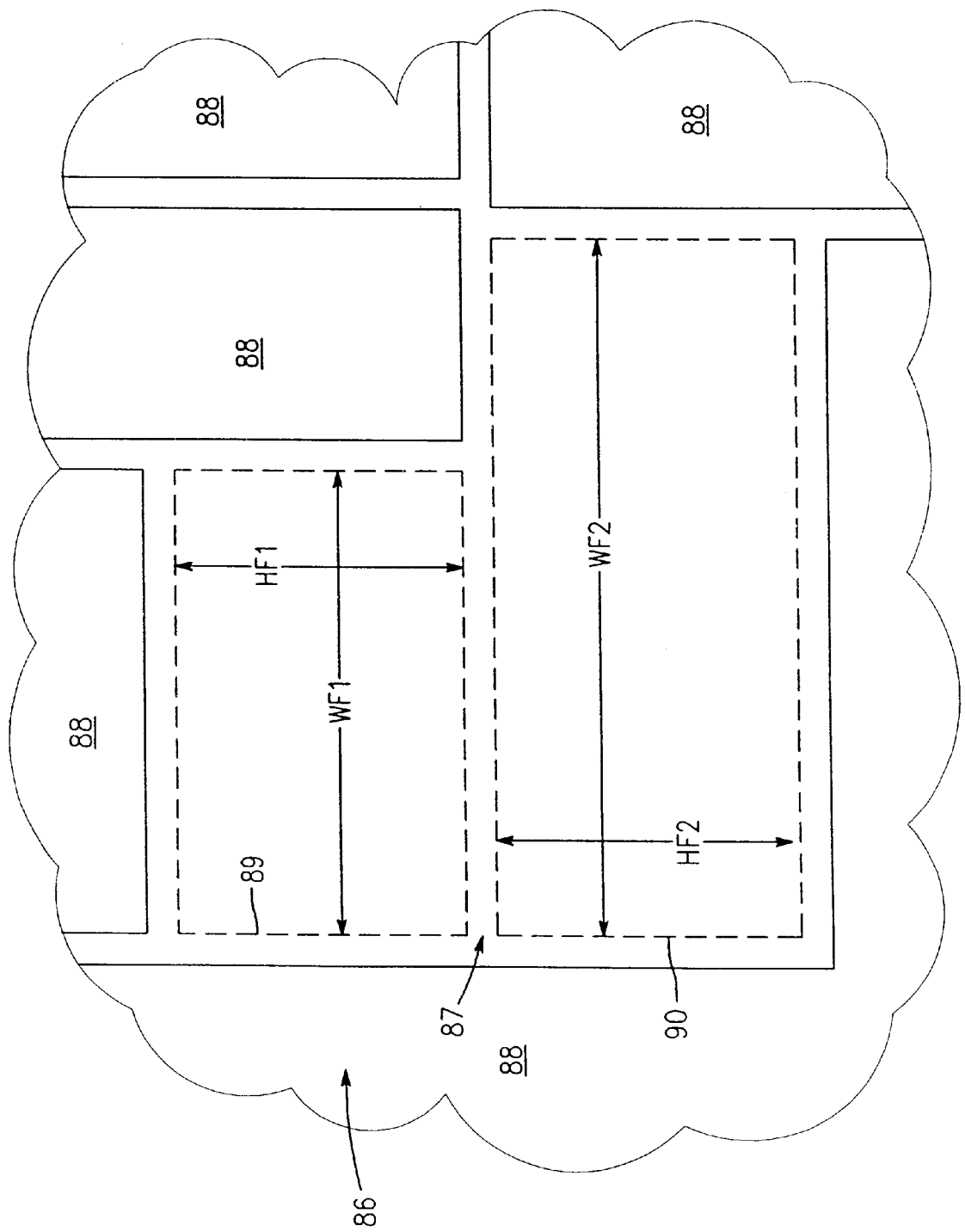
FIG. 7 is a plan view of a portion of an integrated circuit chip layout showing another free area for receiving a decoupling capacitor according to the invention.
Figure 8:
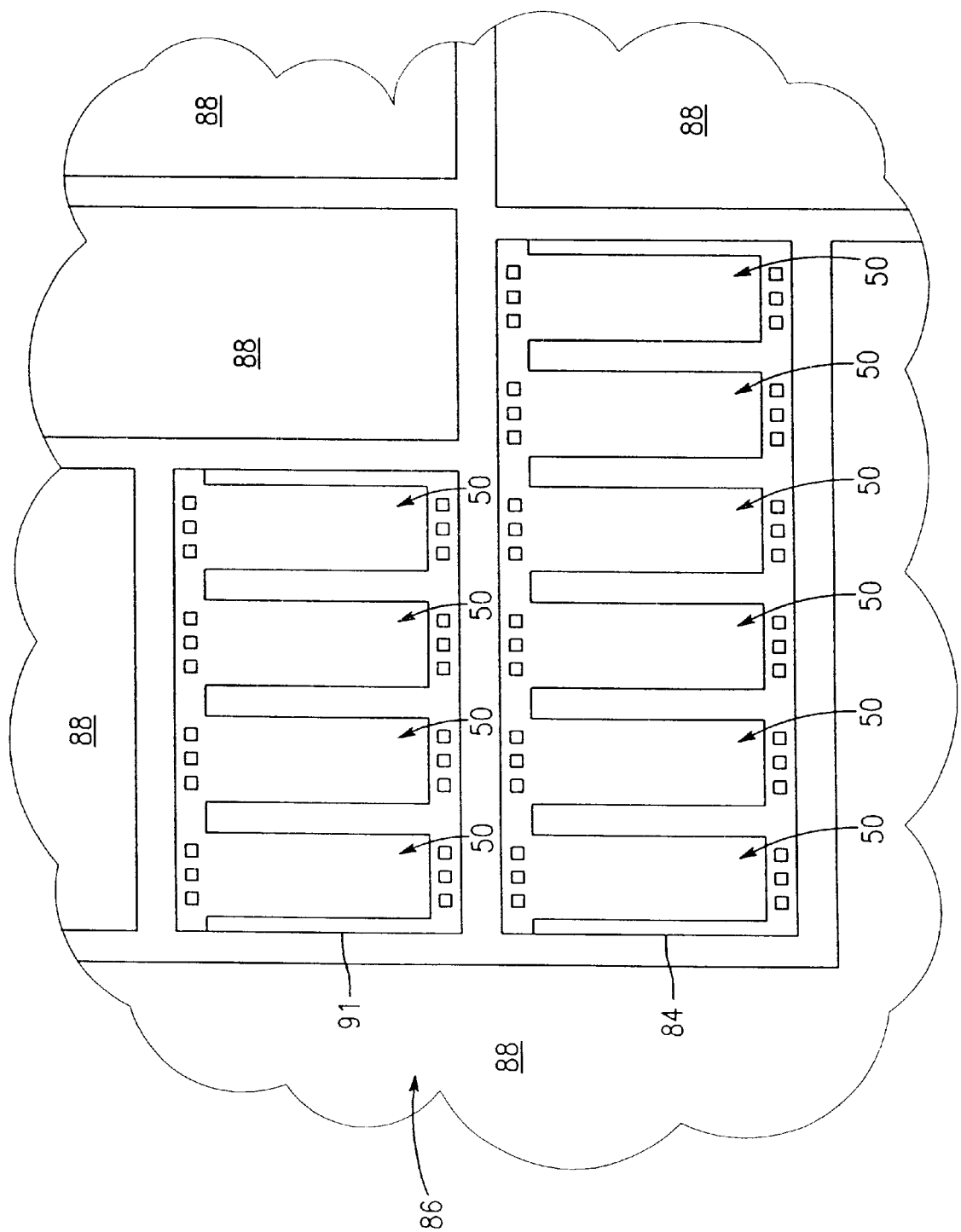
FIG. 8 is a plan view similar to FIG. 7, showing the decoupling capacitor arrangement lay out in the free area.

FIG. 7 shows a circuit layout 86 with an irregular free area 87 surrounded by circuit blocks 88. The method of laying out the capacitor arrangements according to the invention may include simply identifying the largest rectangular area in free area 87. However, one preferred form of the invention comprises dividing irregularly shaped free area 87 into multiple rectangular free areas, in this case rectangular free areas 89 and 90. First free area 89 includes a height dimension HF1 and a width dimension WF1. Second free area 90 includes height dimension HF2 and width dimension WF2. The selection step in this preferred form of the invention includes addressing each free area 89 and 90 individually. As described above with reference to FIGS. 5 and 6, second free area 90 will accommodate capacitor arrangement 84 which is six individual capacitor structures wide, each capacitor structure shown at reference numeral 50. First free area 89 will accommodate a capacitor arrangement 91 which is four capacitor structures wide. Height dimensions HF1 and HF2 are each within the predefined height dimension range so that the height dimension for capacitor arrangement 84 is chosen as HF2 for free area 90, and the height dimension for capacitor arrangement 91 is chosen as HF1 for free area 89. This layout makes the most of free area 87 for decoupling capacitors while maintaining the same basic capacitor arrangement.

It will be appreciated that the examples shown in FIGS. 5 through 8 are highly simplified representational examples shown for purposes of illustrating the invention. A particular free area may accommodate a capacitor arrangement according to the invention which includes hundreds of side-by-side capacitor structures 50. In this case the process according to the invention would select a capacitor arrangement with hundreds of capacitor structures. Alternatively, the process could include a maximum width dimension for each individual capacitor arrangement and then place multiple arrangements side-by-side to fill a free area having a width dimension over the maximum width dimension for a single capacitor arrangement. For example, if capacitor arrangements were limited to 3 side-by-side capacitor structures 50 then in the example shown in FIGS. 5 and 6, free area 82 would be filled with two individual capacitor arrangements according to the invention, each with three individual capacitor structures 50. Also, it will be appreciated that the dimension of a free area chosen as the height dimension and the dimension chosen as the width dimension may be chosen to maximize the area of the capacitor arrangements which may be placed in the free area.

The above described preferred embodiments are intended to illustrate the principles of the invention, but not to limit the scope of the invention. Various other embodiments and modifications to these preferred embodiments may be made by those skilled in the art without departing from the scope of the following claims.

What is claimed is:

1. A method for laying out a capacitor arrangement in a free area of an integrated circuit chip, the method comprising the steps of:

(a) defining a capacitor arrangement height dimension range between a maximum height dimension and a minimum height dimension;

(b) defining a plurality of capacitor arrangement width dimensions, the capacitor arrangement width dimensions being transverse to the maximum height dimension; and (c) applying the capacitor arrangement height dimension range and the plurality of capacitor arrangement width dimensions to select a particular capacitor arrangement for the free area, the selected capacitor arrangement comprising an arrangement with the largest area which is accommodated within the free area subject to the capacitor arrangement height dimension range and the plurality of capacitor arrangement width dimensions.

2. The method of claim 1 further comprising the step of:
(a) identifying the free area in an integrated circuit layout and determining a width dimension and a height dimension for the free area.

3. The method of claim 2 wherein the step of applying the capacitor arrangement height dimension range and the plurality of capacitor arrangement width dimensions to select the particular capacitor arrangement for the free area comprises the steps of:
(a) selecting from the plurality of capacitor arrangement width dimensions a maximum capacitor arrangement width dimension, the maximum capacitor arrangement width dimension comprising the greatest capacitor arrangement width dimension which is less than or equal to the free area width dimension, and within the plurality of width dimensions; and
(b) selecting a capacitor arrangement height dimension, the selected capacitor arrangement height dimension comprising the greatest height dimension which is less than or equal to the free area height dimension, and within the capacitor arrangement height dimension range.

4. The method of claim 1 further comprising the step of:
(a) identifying an irregular free area in the integrated circuit chip;
(b) dividing the irregular free area into at least one rectangular free area, said at least one free area comprising the free area for which the particular capacitor arrangement is selected.

5. The method of claim 4 wherein the step of dividing the irregular free area into at least one rectangular free area includes dividing the irregular free area into a plurality of rectangular free areas based upon the capacitor arrangement height dimension range and the plurality of capacitor arrangement width dimensions, each rectangular free area including a respective free area width dimension and a respective free area height dimension.

6. The method of claim 5 further comprising the steps of:
(a) for each respective rectangular free area, selecting from the plurality of capacitor arrangement width dimensions a maximum capacitor arrangement width dimension, the maximum capacitor arrangement width dimension comprising the greatest capacitor arrangement width dimension which is less than or equal to the respective free area width dimension, and within the plurality of width dimensions; and
(b) for each respective rectangular free area, selecting a capacitor arrangement height dimension, the selected capacitor arrangement height dimension comprising the greatest height dimension which is less than or equal to the respective free area height dimension, and within the capacitor arrangement height dimension range.

7. A processing system for use in laying out a capacitor arrangement in a free area of an integrated circuit chip to increase on-chip capacitance, the system comprising:
(a) a height input arrangement for inputting a capacitor arrangement height dimension range between a maximum height dimension and a minimum height dimension;
(b) a width input arrangement for inputting an expression defining a plurality of capacitor arrangement width dimensions, the capacitor arrangement width dimensions being transverse to the maximum height dimension; and
(c) a sizing processor for applying the capacitor height dimension range and the plurality of capacitor arrangement width dimensions to select a particular capacitor arrangement for the free area, the selected capacitor arrangement comprising an arrangement with the largest area which is accommodated within the free area subject to the capacitor height dimension range and the plurality of capacitor arrangement width dimensions.

8. The processing system of claim 7 further comprising:
(a) a free area identifying arrangement for identifying the free area in an integrated circuit layout and determining a width dimension and a height dimension for the free area.

9. The processing system of claim 8:
(a) wherein the sizing processor selects from the plurality of capacitor arrangement width dimensions a maximum capacitor arrangement width dimension, the maximum capacitor arrangement width dimension comprising the greatest capacitor arrangement width dimension which is less than or equal to the free area width dimension, and within the plurality of width dimensions; and
(b) wherein the sizing processor selects a capacitor arrangement height dimension, the selected capacitor arrangement height dimension comprising the greatest height dimension which is less than or equal to the free area height dimension, and within the capacitor arrangement height dimension range.

10. The processing system of claim 7 further comprising:
(a) an irregular free area identifying arrangement for identifying an irregular free area in the integrated circuit chip;
(b) an irregular free area dividing arrangement for dividing the irregular free area into at least one rectangular free area, said at least one free area comprising the free area for which the particular capacitor arrangement is selected.

11. The processing system of claim 10:
(a) wherein the irregular free area dividing arrangement divides the irregular free area into a plurality of rectangular free areas based upon the capacitor height dimension range and the plurality of capacitor arrangement width dimensions, each rectangular free area including a respective free area width dimension and a respective free area height dimension.

12. The processing system of claim 11 wherein:
(a) for each respective rectangular free area, the sizing processor selects from the plurality of capacitor arrangement width dimensions a maximum capacitor arrangement width dimension, the maximum capacitor arrangement width dimension comprising the greatest capacitor arrangement width dimension which is less than or equal to the respective free area width dimension, and within the plurality of width dimensions; and
(b) for each respective rectangular free area, the sizing processor selects a capacitor arrangement height dimension, the selected capacitor arrangement height dimension comprising the greatest height dimension which is less than or equal to the respective free area height dimension, and within the capacitor arrangement height dimension range.

13. A computer program product for use in laying out a capacitor arrangement in a free area of an integrated circuit chip to increase on-chip capacitance, the computer program product comprising computer readable program code stored on a computer readable storage medium and including:
   (a) height input program code for receiving from an input arrangement a capacitor arrangement height dimension range between a maximum height dimension and a minimum height dimension;
   (b) width input program code for receiving from the input arrangement an expression defining a plurality of capacitor arrangement width dimensions, the capacitor arrangement width dimensions being transverse to the maximum height dimension; and
   (c) sizing program code for applying the capacitor arrangement height dimension range and the plurality of capacitor arrangement width dimensions to select a particular capacitor arrangement for the free area, the selected capacitor arrangement comprising an arrangement with the largest area which is accommodated within the free area subject to the capacitor arrangement height dimension range and the plurality of capacitor arrangement width dimensions.

14. The computer program product of claim 13 further comprising:
   (a) free area identifying program code for identifying the free area in an integrated circuit layout and determining a width dimension and a height dimension for the free area.

15. The computer program product of claim 13:
   (a) wherein the sizing program code selects from the plurality of capacitor arrangement width dimensions a maximum capacitor arrangement width dimension, the maximum capacitor arrangement width dimension comprising the greatest capacitor arrangement width dimension which is less than or equal to the free area width dimension, and within the plurality of width dimensions; and
   (b) wherein the sizing program code also selects a capacitor arrangement height dimension, the selected capacitor arrangement height dimension comprising the greatest height dimension which is less than or equal to the free area height dimension, and within the capacitor arrangement height dimension range.

16. The computer program product of claim 13 further comprising:
   (a) irregular free area identifying program code for identifying an irregular free area in the integrated circuit chip;
   (b) irregular free area dividing program code for dividing the irregular free area into at least one rectangular free area, said at least one free area comprising the free area for which the particular capacitor arrangement is selected.

17. The computer program product of claim 16:
   (a) wherein the irregular free area dividing program code divides the irregular free area into a plurality of rectangular free areas based upon the capacitor arrangement height dimension range and the plurality of capacitor arrangement width dimensions, each rectangular free area including a respective free area width dimension and a respective free area height dimension.

18. The computer program product of claim 17 wherein:
   (a) for each respective rectangular free area, the sizing processor selects from the plurality of capacitor arrangement width dimensions a maximum capacitor arrangement width dimension, the maximum capacitor arrangement width dimension comprising the greatest capacitor arrangement width dimension which is less than or equal to the respective free area width dimension, and within the plurality of width dimensions; and
   (b) for each respective rectangular free area, the sizing processor selects a capacitor arrangement height dimension, the selected capacitor arrangement height dimension comprising the greatest height dimension which is less than or equal to the respective free area height dimension, and within the capacitor arrangement height dimension range.

\* \* \* \* \*

UNITED STATES PATENT AND TRADEMARK OFFICE
CERTIFICATE OF CORRECTION

PATENT NO.     : 6,480,992 B1                                              Page 1 of 1
DATED          : November 12, 2002
INVENTOR(S)    : Stephen Larry Runyon It is certified that error appears in the above-identified patent and that said Letters Patent is hereby corrected as shown below:

Column 7,
Line 67, delete "w." and replace with -- $w_m$ --

Signed and Sealed this

Thirteenth Day of May, 2003

JAMES E. ROGAN
*Director of the United States Patent and Trademark Office*